(12) United States Patent
Hashimoto et al.

(10) Patent No.: US 9,803,293 B2
(45) Date of Patent: Oct. 31, 2017

(54) METHOD FOR PRODUCING GROUP III-NITRIDE WAFERS AND GROUP III-NITRIDE WAFERS

(75) Inventors: Tadao Hashimoto, Santa Barbara, CA (US); Edward Letts, Buellton, CA (US); Masanori Ikari, Santa Barbara, CA (US)

(73) Assignee: SixPoint Materials, Inc., Buellton, CA (US)

( * ) Notice: Subject to any disclaimer, the term of this patent is extended or adjusted under 35 U.S.C. 154(b) by 2319 days.

(21) Appl. No.: 12/392,960

(22) Filed: Feb. 25, 2009

(65) Prior Publication Data

US 2009/0256240 A1    Oct. 15, 2009

Related U.S. Application Data

(60) Provisional application No. 61/067,117, filed on Feb. 25, 2008.

(51) Int. Cl.
| | | |
|---|---|---|
| C30B 15/14 | (2006.01) | |
| C30B 29/40 | (2006.01) | |
| C30B 7/10 | (2006.01) | |
| C30B 33/02 | (2006.01) | |

(52) U.S. Cl.
CPC ............. C30B 29/403 (2013.01); C30B 7/10 (2013.01); C30B 29/406 (2013.01); C30B 33/02 (2013.01)

(58) Field of Classification Search
None
See application file for complete search history.

(56) References Cited

U.S. PATENT DOCUMENTS

| | | | |
|---|---|---|---|
| 2,962,838 A | 12/1960 | Kebler et al. | |
| 4,396,529 A | 8/1983 | Price et al. | |
| 4,874,458 A | 10/1989 | Nishizawa | |
| 5,942,148 A | 8/1999 | Preston | |
| 6,117,213 A | 9/2000 | Ueda et al. | |

(Continued)

FOREIGN PATENT DOCUMENTS

| | | |
|---|---|---|
| CN | 101061570 | 10/2007 |
| EP | 0827192 | 4/1998 |

(Continued)

OTHER PUBLICATIONS

Matocha, Kevin et al. "Comparison of metal-oxide-semiconductor capacitors on c- and m-plane gallium nitride" Applied Physics Letter 90 123511 (2007) 123511-1.*

(Continued)

*Primary Examiner* — Kaj K Olsen
*Assistant Examiner* — Ross J Christie
(74) *Attorney, Agent, or Firm* — Strategic Innovation IP Law Offices, P.C.

(57) ABSTRACT

The present invention discloses a production method for group III nitride ingots or pieces such as wafers. To solve the coloration problem in the wafers grown by the ammonothermal method, the present invention composed of the following steps; growth of group III nitride ingots by the ammonothermal method, slicing of the ingots into wafers, annealing of the wafers in a manner that avoids dissociation or decomposition of the wafers. This annealing process is effective to improve transparency of the wafers and/or otherwise remove contaminants from wafers.

30 Claims, 4 Drawing Sheets

(56) References Cited

U.S. PATENT DOCUMENTS

| | | | |
|---|---|---|---|
| 6,156,581 A | 12/2000 | Vaudo et al. | |
| 6,177,057 B1 | 1/2001 | Purdy | |
| 6,177,059 B1 | 1/2001 | Matsuda et al. | |
| 6,190,629 B1 | 2/2001 | Solomon et al. | |
| 6,316,785 B1 | 11/2001 | Nunoue et al. | |
| 6,326,313 B1 | 12/2001 | Couteau et al. | |
| 6,398,867 B1 | 6/2002 | D'Evelyn et al. | |
| 6,406,540 B1 | 6/2002 | Harris | |
| 6,441,393 B2 | 8/2002 | Goetz et al. | |
| 6,562,124 B1 | 5/2003 | Ivantzov et al. | |
| 6,569,238 B2 | 5/2003 | Ishida | |
| 6,596,079 B1 | 7/2003 | Vaudo et al. | |
| 6,656,615 B2 | 12/2003 | Dwilinski et al. | |
| 7,017,514 B1 | 3/2006 | Shepherd et al. | |
| 7,033,439 B2 | 4/2006 | Shibata et al. | |
| 7,078,731 B2 | 7/2006 | D'Evelyn et al. | |
| 7,132,730 B2 | 11/2006 | Dwilinski et al. | |
| 7,160,388 B2 | 1/2007 | Dwilinski et al. | |
| 7,169,227 B2 | 1/2007 | Maruska et al. | |
| 7,170,095 B2 | 1/2007 | Vaudo et al. | |
| 7,303,632 B2 | 12/2007 | Negley | |
| 7,589,000 B2 | 9/2009 | Kasai et al. | |
| 7,704,324 B2 | 4/2010 | D'Evelyn et al. | |
| 7,749,325 B2 | 7/2010 | Nakayama | |
| 7,847,313 B2 | 12/2010 | Shibata | |
| 8,092,597 B2 | 1/2012 | Dmitriev et al. | |
| 8,236,267 B2 | 8/2012 | Hashimoto et al. | |
| 8,337,798 B2 | 12/2012 | Sarayama et al. | |
| 8,357,243 B2 | 1/2013 | Hashimoto et al. | |
| 8,420,041 B2 | 4/2013 | Hashimoto et al. | |
| 8,557,043 B2 | 10/2013 | Hashimoto et al. | |
| 8,585,822 B2 | 11/2013 | Hashimoto et al. | |
| 8,728,234 B2 | 5/2014 | Letts et al. | |
| 8,764,903 B2 | 7/2014 | Hashimoto et al. | |
| 8,852,341 B2 | 10/2014 | Letts et al. | |
| 9,441,311 B2 | 9/2016 | Hashimoto et al. | |
| 2002/0078881 A1 | 6/2002 | Cuomo et al. | |
| 2002/0136671 A1 | 9/2002 | Otsuka et al. | |
| 2002/0144645 A1 | 10/2002 | Kim et al. | |
| 2002/0177312 A1 | 11/2002 | Tsvetkov et al. | |
| 2002/0192507 A1 | 12/2002 | Dwilinski et al. | |
| 2002/0194953 A1 | 12/2002 | Rosenberg et al. | |
| 2003/0024475 A1 | 2/2003 | Anderson | |
| 2004/0051105 A1 | 3/2004 | Tsuda et al. | |
| 2004/0072383 A1 | 4/2004 | Nagahama et al. | |
| 2004/0089221 A1 | 5/2004 | Dwilinski et al. | |
| 2004/0124434 A1 | 7/2004 | D'Evelyn et al. | |
| 2004/0226588 A1 | 11/2004 | Onishi et al. | |
| 2004/0245535 A1 | 12/2004 | D'Evelyn et al. | |
| 2004/0261692 A1 | 12/2004 | Dwilinski et al. | |
| 2004/0262630 A1 | 12/2004 | Kitaoka et al. | |
| 2005/0053513 A1 | 3/2005 | Pike, Jr. | |
| 2005/0059229 A1 | 3/2005 | Minemoto et al. | |
| 2005/0098095 A1* | 5/2005 | D'Evelyn et al. | 117/105 |
| 2005/0121688 A1 | 6/2005 | Nagai et al. | |
| 2005/0126471 A1 | 6/2005 | Jenny et al. | |
| 2005/0142391 A1 | 6/2005 | Dmitriev et al. | |
| 2005/0161697 A1 | 7/2005 | Nakahata et al. | |
| 2005/0166835 A1 | 8/2005 | Koukitsu et al. | |
| 2005/0224783 A1 | 10/2005 | Matsuyama et al. | |
| 2005/0258451 A1 | 11/2005 | Saxler et al. | |
| 2006/0011135 A1 | 1/2006 | Dmitriev et al. | |
| 2006/0037530 A1* | 2/2006 | Dwilinski et al. | 117/70 |
| 2006/0054076 A1 | 3/2006 | Dwilinski et al. | |
| 2006/0057749 A1 | 3/2006 | Dwilinski et al. | |
| 2006/0118799 A1 | 6/2006 | D'Evelyn et al. | |
| 2006/0177362 A1 | 8/2006 | D'Evelyn et al. | |
| 2006/0191472 A1 | 8/2006 | Dwilinski et al. | |
| 2006/0210800 A1 | 9/2006 | Spitsberg et al. | |
| 2006/0213430 A1 | 9/2006 | Jenny et al. | |
| 2006/0255341 A1 | 11/2006 | Pinnington et al. | |
| 2006/0280668 A1 | 12/2006 | Dmitriev et al. | |
| 2006/0282229 A1 | 12/2006 | Kim et al. | |
| 2007/0012242 A1 | 1/2007 | Jurisch et al. | |
| 2007/0032046 A1 | 2/2007 | Dmitriev et al. | |
| 2007/0034299 A1 | 2/2007 | Machida et al. | |
| 2007/0084399 A1 | 4/2007 | Sarayama et al. | |
| 2007/0148920 A1 | 6/2007 | Kasai et al. | |
| 2007/0157876 A1* | 7/2007 | Minemoto et al. | 117/109 |
| 2007/0158785 A1 | 7/2007 | D'Evelyn et al. | |
| 2007/0181056 A1 | 8/2007 | D'Evelyn et al. | |
| 2007/0196942 A1 | 8/2007 | Kitaoka et al. | |
| 2007/0218703 A1 | 9/2007 | Kaeding et al. | |
| 2007/0232051 A1 | 10/2007 | Wang et al. | |
| 2007/0234946 A1 | 10/2007 | Hashimoto et al. | |
| 2007/0240630 A1 | 10/2007 | Leonard et al. | |
| 2007/0252164 A1 | 11/2007 | Zhong et al. | |
| 2007/0290230 A1 | 12/2007 | Kawaguchi et al. | |
| 2008/0001165 A1 | 1/2008 | Hashimoto et al. | |
| 2008/0006844 A1 | 1/2008 | D'Evelyn et al. | |
| 2008/0008855 A1 | 1/2008 | D'Evelyn et al. | |
| 2008/0102016 A1 | 5/2008 | Hashimoto | |
| 2008/0111144 A1* | 5/2008 | Fichtenbaum et al. | 257/96 |
| 2008/0118733 A1 | 5/2008 | Oshima | |
| 2008/0156254 A1 | 7/2008 | Dwilinski et al. | |
| 2009/0256240 A1 | 10/2009 | Hashimoto et al. | |
| 2009/0283029 A1 | 11/2009 | Arena et al. | |
| 2010/0158785 A1 | 6/2010 | Fujito | |
| 2010/0213576 A1 | 8/2010 | Hiranaka et al. | |
| 2010/0285657 A1 | 11/2010 | Hashimoto et al. | |
| 2013/0119399 A1 | 5/2013 | Hashimoto et al. | |
| 2013/0135005 A1 | 5/2013 | Hashimoto et al. | |
| 2013/0206057 A1 | 8/2013 | Hashimoto et al. | |
| 2014/0174340 A1 | 6/2014 | Letts et al. | |
| 2014/0209925 A1 | 7/2014 | Letts et al. | |
| 2014/0326175 A1 | 11/2014 | Hashimoto et al. | |
| 2015/0075421 A1 | 3/2015 | Hashimoto et al. | |
| 2016/0002817 A1 | 1/2016 | Hashimoto et al. | |
| 2016/0010238 A1 | 1/2016 | Hashimoto et al. | |

FOREIGN PATENT DOCUMENTS

| | | |
|---|---|---|
| EP | 1041610 A1 | 4/2000 |
| EP | 1 110 600 A2 | 6/2001 |
| EP | 1172464 | 1/2002 |
| EP | 1777325 | 4/2007 |
| EP | 1 818 429 A2 | 8/2007 |
| JP | 50/109896 | 8/1975 |
| JP | 10-125653 | 5/1998 |
| JP | 2001/102307 | 4/2001 |
| JP | 2002-029897 | 1/2002 |
| JP | 2002/261014 A | 9/2002 |
| JP | 2003-040699 | 2/2003 |
| JP | 2004-002152 | 8/2004 |
| JP | 2004-284876 | 10/2004 |
| JP | 2005-008444 | 1/2005 |
| JP | 2005/119893 | 5/2005 |
| JP | 2005-288350 | 10/2005 |
| JP | 2006/069827 | 3/2006 |
| JP | 2006-509708 | 3/2006 |
| JP | 2006/193355 | 7/2006 |
| JP | 2007/238344 | 9/2007 |
| JP | 2007/238346 | 9/2007 |
| JP | 2007/238347 | 9/2007 |
| JP | 2007/262815 | 10/2007 |
| JP | 2007-290921 | 11/2007 |
| JP | 2008/501600 | 1/2008 |
| JP | 2008 127252 | 6/2008 |
| JP | 2009-536920 | 4/2009 |
| JP | 5241855 | 9/2009 |
| JP | 2013-126945 | 6/2013 |
| TW | 200427879 | 12/2004 |
| TW | 200716483 | 5/2007 |
| WO | WO 99/23693 | 5/1999 |
| WO | WO 03-035945 A2 | 5/2003 |
| WO | WO 2004-003261 A1 | 1/2004 |
| WO | WO 2004/053206 | 6/2004 |
| WO | WO2004/0543210 A1 | 6/2004 |
| WO | WO 2004-061923 A1 | 7/2004 |
| WO | WO2005/121133 | 12/2005 |
| WO | WO 2006-057463 A1 | 6/2006 |
| WO | WO 2006-080959 A1 | 8/2006 |
| WO | WO2006098458 A1 | 9/2006 |
| WO | WO 2007-008198 A1 | 1/2007 |

(56) References Cited

FOREIGN PATENT DOCUMENTS

| WO | WO 2007-078844 A2 | 7/2007 |
|---|---|---|
| WO | WO 2007-117689 A2 | 10/2007 |
| WO | WO 2007-133512 A2 | 11/2007 |
| WO | WO2007122866 A1 | 11/2007 |
| WO | WO 2007-149487 A2 | 12/2007 |
| WO | WO 2008-051589 A2 | 5/2008 |
| WO | WO 2008/064109 A2 | 5/2008 |
| WO | WO 2009/04784 | 4/2009 |

OTHER PUBLICATIONS

PCT/US2009/035140, WO International Search Report dated May 29, 2009, pp. 4.

PCT/US2009/035140, WO Written Opinion dated May 29, 2009, pp. 6.

PCT/US2009/035140, WO International Preliminary Report on Patentability dated Mar. 17, 2010, pp. 8.

PCT/US2009/046316, WO International Search Report and Written Opinion dated Oct. 22, 2009, pp. 18.

PCT/US2009/061022, WO International Search Report and Written Opinion dated Jan. 21, 2010, pp. 10.

PCT/US2009/003557, WO International Search Report dated Oct. 26, 2009 pp. 4.

PCT/US2009/046317, WO International Search Report and Written Opinion, dated Sep. 25, 2009 pp. 15.

PCT/US2009/065513, WO International Search Report and Written Opinion, dated Feb. 3, 2010; pp. 15.

Aoki, M., et al., "GaN single crystal growth using high-purity Na as a flux," Journal of Crystal Growth, 2002, pp. 70-76; 242; Elsevier, www.elsevier.com/locate/jcrysgro.

Bliss, D. F., et al., "Aluminum nitride substrate growth by halide vapor transport epitaxy," Journal of Crystal Growth, 2003, pp. 1-6, vol. 250; Elsevier, www.elsevier.com/locate/jcrysgro.

Callahan, Michael J., et al "Growth of GaN crystals under ammonothermal conditions," Material Research Society, vol. 798, 2004, pp. YS.10.1-Y2.10.6.

Callahan, M., et al., "Gan single crystals grown on HVPE seeds in alkaline supercritical ammonia," J Mater Sci, 2006, pp. 1399-1407, 41.

Chen, Q. S., et al., "Modeling of ammonothermal growth of nitrides," Journal of Crystal Growth, 2003, pp. 181-187, 258; Elsevier, www.elsevier.com/locate/jcrysgro.

Dwilinski, R., et al., "Ammono method of BN, AlN, and GaN synthesis and crystal growth," MRS Internet Journal of Nitride Semiconductor Research, 1998, pp. 1-4; 3, 25.

Dwilinski, R., et al., Ammono method of GaN and AlN production, Diamond and Related Materials, 1998, pp. 1348-1350, 7; Elsevier.

Dwilinski, R., et al., "On GAN Crystallization by Ammonothermal Method," Acta Physica Polonica A, 1996, pp. 763-766, No. 4, vol. 90.

Etzkorn, E. V., et al. "Cracking of GaN Films" Journal of Applied Physics, Jan. 15, 2001, pp. 1025-1034, vol. 89, No. 2, XP001011762, American Institute of Physics.

Hashimoto, Tadao et al. "A GaN bulk crystal with improved structural quality grown by the ammonothermal method," Published online: Jul. 2007; Nature Materials Advance Online Publication www.nature.com/naturematerials; pp. 1-3.

Hashimoto, Tadao et al. "Ammonothermal growth of GaN utilizing negative temperature dependence of solubility in basic ammonia" Mater. Res. Soc. Symp. Proc., 2005, pp. E2.8.1.-E.2.8.6., vol. 831, Materials Research Society.

Hashimoto, Tadao et al. "Growth of Bulk GaN Crystals by the Basic Ammonothermal Method," Japanese Journal of Applied Physics, 2007, pp. L889-L891, vol. 46, No. 37, The Japanese Society of Applied Physics, JJAP Express Letter.

Hashimoto, Tadao et al. "Growth of bulk GaN with Low Dislocation Density by the Ammonothermal Method Using Polycrystalline GaN Nutrient" Japanese Journal of Applied Physics, 2007, pp. L525-L527, vol. 46, No. 22, The Japanese Society of Applied Physics, JJAP Express Letter.

Hashimoto, Tadao et al. "Growth of gallium nitride via fluid transport in supercritical ammonia," Journal of Crystal Growth, 2005, pp. e525-e530; 275, Elsevier, www.elsevier.com/locate/jcrysgro.

Hashimoto, Tadao et al. "Phase selection of microcrystalline GaN synthesized in supercritical ammonia" Journal of Crystal Growth, 2006, pp. 100-106; 291, Elsevier, www.elsevier.com/locate/jcrysgro.

Hashimoto, Tadao et al. "Seeded growth of GaN by the basic ammonothermal method" Journal of Crystal Growth, 2007, pp. 311-316; 305, Elsevier, www.elsevier.com/locate/jcrysgro.

Hashimoto, Tadao et al. "Status and perspectives of the ammonothermal growth of GaN substrates" Journal of Crystal Growth, 2008, pp. 876-880; 310, Elsevier, www.elsevier.com/locate/jcrysgro.

Hashimoto, Tadao et al. "Structural Characterization of Thick GaN Films Grown of Free-Standing GaN Seeds by the Ammonothermal Method Using Basic Ammonia," Japanese Journal of Applied Physics, 2005, pp. L 797-L 799, vol. 44, No. 25, The Japan Society of Applied Physics, JJAP Express Letter.

Inoue, T., et al., "Pressure-Controlled Solution Growth of Bulk GaN Crystals under High Pressure," 2001, pp. 15-27; 223, 15, Phys. Stat. Sol. (b).

Iwahashi, et al., "Effects of ammonia gas on threshold pressure and seed growth for bulk GaN single crystals by Na flux method," Journal of Crystal Growth, 2003, pp. 1-5, 253; Elsevier, www.elsevier.com/locate/jcrysgro.

Ketchum, Douglas R., et al. "Crystal growth of gallium nitride in supercritical ammonia," Journal of Crystal Growth, 2001, pp. 431-434, 222; Elsevier, www.elsevier.nl/locate/jcrysgro.

Kumagai, Y., et al., "Growth of thick AlN layers by hydride vapor phase epitaxy," Journal Crystal Growth, 2005, pp. 62-67, vol. 281; Elsevier, www.elsevier.com/locate/jcrysgro.

Kumagai, Y., et al., "Hydride vapor phase epitaxy of AlN: thermodynamic analysis of aluminum source and its application to growth," Phys. Stat. Sol. ( c), 2003, pp. 2498-2501, vol. 0, No. 7.

Ledyaev, O., et al., Properties of AlN Layers Grown on SiC Substrates in Wide Temperature Range by HVPE, Phys. Stat. Sol. ( c) ,2002, pp. 474-478, No. 1.

Ohshima, E ., et al. , "Growth of the 2-in-size bulk ZnO single crystals by the hydrothermal method," Journal of Crystal Growth, 2004, pp. 166-170, 260; Elsevier, www.eisevier.com/locale/jcrysgro.

Peters, D. et al., "Ammonothermal Synthesis of Aluminum Nitride," Journal of Crystal Growth, 1990, pp. 411-418, 104.

Porowski. S., "Near Defect Free GaN Substrates," MRS Internet Journal of Nitride Semiconductors, Res. 4S1, 1999, G1.3.

Purdy, A. P., et al. "Ammonothermal Recrystallization of Gallium Nitride with Acidic Mineralizers," Cyst. Growth Design, 2002, pp. 141-145, vol. 2, No. 2.

Ramachandran, V. et al., "Inversion of wurtzite GaN(0001) by exposure to magnesium," Applied Physics Letters, Aug. 9, 1999, pp. 808-810, vol. 75, No. 6.

Wu, H. et al., "Rapid Synthesis of High Purity GaN Powder," Phys. Stat. Sol. (c), 2005, pp. 2074-2078, New York.

Yamane, Y. , et al., "Growth of thick AlN layer on sapphire (0001) substrate using hydride vapor phase epitaxy," Phys. Stat. Sol. ( c), 2005, pp. 2062-2065, vol. 2, No. 7.

U.S. Appl. No. 12/455,683 Office Action dated Apr. 26, 2011.

U.S. Appl. No. 12/455,683 Office Action dated Oct. 13, 2011.

U.S. Appl. No. 12/455,683 Amendment dated Feb. 13, 2012.

U.S. Appl. No. 12/455,683 Notice of Allowance dated Mar. 15, 2012.

U.S. Appl. No. 12/455,683 Response dated Apr. 26, 2011 Non-Final Office Action filed Jul. 26, 2011.

U.S. Appl. No. 12/455,760 Amendment dated Mar. 23, 2012.

U.S. Appl. No. 12/455,760 Office Action dated Nov. 23, 2011.

U.S. Appl. No. 12/456,181 Office Action dated Sep. 4, 2012.

U.S. Appl. No. 12/455,760 Office Action dated Oct. 12, 2012.

(56) References Cited

OTHER PUBLICATIONS

U.S. Appl. No. 12/456,181 Notice of Allowance dated Oct. 29, 2012.
U.S. Appl. No. 12/456,181 Amendment dated Sep. 26, 2012.
Hashimoto, Tadao et al., "Ammonothermal Growth of GaN on an over-1-inch Seed Crystal," Japanese Journal of Applied Physics, 2005, pp. L 1570-L 1572, vol. 44, No. 52, The Japan Society of Applied Physics, JJAP Express Letter.
Jacobson, Loren A., Crystal Symmetries, METE 327: Physical Metallurgy, Department of Material and Metallurgical Engineering, New Mexico Institute of Mining and Technology (May 16, 2008).
Schineller, B., et al. "Vertical-HVPE as a Production Method for Free-Standing GaN-Substrates", CS Mantech Conference, May 14-17 2007 Austin TX [USA]; [Online] 07A, May 14, 2007, pp. 123-126, XP002592188; URL:http://www.gaasmantech.org/Digests/2007/2007%20Papers/07a.pdf.
PCT/US09/061022 International Preliminary Report on Patentability dated Apr. 19, 2011 and Written Opinion, pp. 6.
PCT/US2009/046317 International Preliminary Report on Patentability dated Dec. 6, 2010 and Written Opinion, pp. 9.
PCT/US2009/065513 International Preliminary Report on Patentability dated May 24, 2011 and Written Opinion, pp. 8.
PCT/US2010/033790 International Search Report, dated Oct. 26, 2010, pp. 6.
EP9762938 Office Action dated May 30, 2012.
JP2010540956 Office Action dated Aug. 14, 2012.
JP2010548751 (Japanese and English translation) Office Action dated Sep. 4, 2012.
JP2010188936 Office Action (Japanese and English translation) dated Sep. 7, 2012.
JP2010188935 Office Action (Japanese and English translation) dated Sep. 7, 2012.
JP2010188934 Office Action (Japanese and English translation) dated Sep. 7, 2012.
JP2010548951 Office Action (Japanese and English translation) dated Sep. 7, 2012.
EP9762938 Amendment dated Oct. 9, 2012.
PCT/US09/046316 International Preliminary Report on Patentability dated Dec. 6, 2010 and Written Opinion, pp. 13.
PCT/US2009/003557, International Preliminary Report on Patentability dated Dec. 14, 2010 and Written Opinion, pp. 8.
JP2010540958 Amendment filed Dec. 21, 2012.
JP2010548751 (Japanese and English translation) Amendment dated Jan. 7, 2013.
JP2010540958 Office Action, Japanese with English translation, dated Jan. 21, 2013.
U.S. Appl. No. 13/491,392 Notice of Allowance dated Dec. 3, 2012.
JP2010188934 Office Action (Japanese and English translation) dated Nov. 12, 2013.
JP2010548951 Office Action (Japanese and English translation) dated Nov. 15, 2013.
EP09762938.0 Office Action dated Nov. 13, 2013.
JP201328632 (Japanese and English translation) Office Action dated Jan. 23, 2014.
TW098118661 Office Action (Taiwanese) dated Jan. 22, 2014 and Search Report (English), dated Jan. 12, 2014, 7 pages.
TW098118664 Office Action (Taiwanese) dated Jan. 22, 2014 and Search Report (English), dated Jan. 12, 2014, 7 pages.
JP2010548951 Amendment (Japanese) dated Feb. 17, 2014.
U.S. Appl. No. 12/580,849 Advisory Action dated Jan. 8, 2014.
U.S. Appl. No. 12/580,849 Amendment dated Dec. 24, 2013.
U.S. Appl. No. 12/580,849 Office Action dated Sep. 24, 2013.
U.S. Appl. No. 12/580,849 RCE and Amendment filed Jan. 24, 2014.
U.S. Appl. No. 12/774,677 Amendment dated Dec. 24, 2013.
Failures Related to Metalworking; pp. 305.
Acid Etch Exam of Forged Alloy Steel for Exiting Grain Flow; SGS Msi; http://www.msitesting.com/metallographic-examination/case-study-acid-etch-examination, pp. 2.
Low, Andrew; Validating the Integrity for Re-Use of a Land Pipeline; http://twi.global.com/technical-knowledge/published-papers/validating -the-integrity; pp. 5.
A Level Grain Structure; Warren School; http://www.the-warren.org/ALevelRevision/engineering/grainstructure.htm; pp. 1-6.
Metallurgical Services; Hurst Metallurgical—Services; http://hurstlab.com/metalllurgical_services.php; p. 1.
U.S. Appl. No. 12/455,760 Office Action dated Jun. 6, 2013.
U.S. Appl. No. 12/455,760 Amendment filed Apr. 11, 2013.
U.S. Appl. No. 12/580,849 Amendment dated Jun. 3, 2013.
U.S. Appl. No. 12/580,849 Office Action dated Mar. 1, 2013.
U.S. Appl. No. 12/624,006) Amendment dated May 28, 2013.
U.S. Appl. No. 12/624,006 Office Action dated Feb. 28, 2013.
U.S. Appl. No. 13/728,769 Office Action dated May 23, 2013.
EP09759458.4 Amendment dated Apr. 30, 2013.
JP2010188934 Amendment (Japanese and English translation) dated Mar. 7, 2013,.
JP2010188934 Office Action (Japanese) dated May 14, 2013,.
JP2010188935 Amendment (Japanese and English translation) dated Mar. 7, 2013.
JP2010188936 Amendment (Japanese and English translation) dated Mar. 7, 2013.
JP2010540956 JP and English translation, Amendment dated Feb. 18, 2013.
JP2010540956 JP, Notice of Allowance dated Mar. 18, 2013.
JP2010548751 (Japanese and English translation) Office Action dated Mar. 15, 2013.
JP2010548951 Amendment (Japanese and English translation) dated Mar. 7, 2013.
JP2010548951 Office Action (Japanese) dated May 14, 2013.
U.S. Appl. No. 14/192,715 Advisory Action dated Apr. 5, 2017.
U.S. Appl. No. 14/864,839 Office Action dated May 5, 2017.
U.S. Appl. No. 14/330,419 Office Action dated May 18, 2017.
U.S. Appl. No. 12/624,006 Office Action dated Aug. 9, 2013.
U.S. Appl. No. 13/728,769 Terminal Disclaimer and Amendment dated Aug. 13, 2013.
U.S. Appl. No. 13/728,799 Notice of Allowance dated Aug. 15, 2013.
U.S. Appl. No. 13/728,769 Notice of Allowance dated Sep. 13, 2013.
U.S. Appl. No. 12/774,677 Office Action dated Sep. 27, 2013.
U.S. Appl. No. 12/624,006 Amendment dated Nov. 8, 2013.
JP2010188934 Amendment (Japanese and English translation) dated Aug. 13, 2013.
JP2010548951 Amendment (Japanese and English translation) dated Aug. 13, 2013.
Wang, Buguo et al., "Ammonothermal Growth of GaN Crystals in Alkaline Solutions" Journal of Crystal Growth, Jan. 2006; pp. 376-380; vol. 287.
ASM Materials Engineering Dictionary, ASM International; ISBN: 0-87170-447-1; © 1992 5 pp. 7.
Durfee, George L.; Flowformed Nickel-Based Superalloy Inconel 718 AMS 5662, dynamicflowfotm precision • engeneered products; www.flowform.com; Oct. 2002;. pp. 2.
Elements of Metallurgy and Englneering Alloys; ASM International: ISBN-13: 978-0-87170-867-0; ASM International, materials Park, Ohio 44073-0002: © 2008; www.asminternational.org., (2pg. cover and 285-287) 5 pages.
Soraa Inches Closer to Affordable GaN Crystals; SORRA—News; www.soraa.com/news/compound-semiconductor-sep-10-2012; Sep. 10, 2012; Compound Semiconductor; 2 pages.
Chichibu, S.F. et al, "Impacts of dislocation bending and impurity incorporation on the local athodoluminescence spectra of GaN grown by ammonothermal method," Applied Physics Letters, Dec. 20, 2007, vol. 91, pp. 251911-1-251911-3.
Monemar, et al., "Growth of Thick GaN Layers with Hydride Vapour Phase Epitaxy," Journal of Crystal Growth 281, pp. 17-31, Apr. 26, 2005, doi:10.1016/j.jcrysgro.2005.03.040
Zajac at al , "Low dislocation Gallium Nitride substrates for space applications", European Space Components Information Exchange System (ESCIES), Ammono SA, ESA contract No. 4000108320/13/NL/KML, https://escies.org/download/webDocumentFile?id=63410, dated May 18, 2015, pp. 5.

(56) References Cited

OTHER PUBLICATIONS

Hashimoto, Tadao, "Affidavit in front of U.S. Appl. No. 12/455,683, dated Jun. 4, 2009", XP055306803, Feb. 11, 2011, 4 pages.
U.S. Appl. No. 12/455,760 Amendment dated Oct. 7 2013.
U.S. Appl. No. 12/624,006 Office Action dated Jan. 15 2014.
U.S. Appl. No. 12/456,760 Notice of Allowance dated Jan. 17, 2014.
U.S. Appl. No. 12/774,877 Notice of Allowance dated Mar. 18, 2014.
U.S. Appl. No. 13/784,210 Interview Summary dated Apr. 2, 2014.
U.S. Appl. No. 12/624,006 Amendment dated Jun. 16, 2014.
U.S. Appl. No. 13/784,210 Office Action dated Jul. 17, 2014.
U.S. Appl. No. 12/580,849 Office Action dated Oct. 2, 2014.
U.S. Appl. No. 13/784,210 Amendment dated Oct. 17, 2014.
U.S. Appl. No. 13/784,210 Office Action dated Dec. 24, 2014.
U.S. Appl. No. 13/847,222 Office Action dated Jan. 20, 2015.
U.S. Appl. No. 12/580,849 Amendment dated Feb. 2, 2015.
U.S. Appl. No.13/784,210 Amendment dated Mar. 24, 2015.
U.S. Appl. No. 13/784,210 Advisory Action dated Apr. 6, 2015.
U.S. Appl. No. 13/847,222 Amendment dated May 20, 2015.
U.S. Appl. No. 12/580,849 Office Action dated Jun. 3, 2015.
U.S. Appl. No. 13/847,222 Office Action dated Jun. 10, 2015.
U.S. Appl. No. 13/784,210 Pre-Brief Conference Request dated Jun. 24, 2015.
U.S. Appl. No. 14/228,628 Office Action dated Jul. 8, 2015.
U.S. Appl. No. 13/784,210 Pre-Brief Appeal Conference Decision dated Jul. 27, 2015.
U.S. Appl. No. 12/580,849 Pre-Appeal Remarks dated Sep. 3, 2015.
U.S. Appl. No. 12/580,849 Pre-Brief Appeal Decision dated Sep. 25, 2015.
U.S. Appl. No. 12/580,849 Amendment dated Nov. 3, 2015.
U.S. Appl. No. 14/228,628 Amendment dated Nov. 9, 2015.
U.S. Appl. No. 14/285,350 Office Action dated Nov. 24, 2015.
U.S. Appl. No. 12/580,849 Office Action dated Jan. 13, 2016.
U.S. Appl. No. 14/285,350 Amendment dated Feb. 24, 2016.
U.S. Appl. No. 14/228,628 Non Final Office Action dated Mar. 26, 2016.
U.S. Appl. No. 12/580,849 Amendment dated Apr. 13, 2016.
U.S. Appl. No. 14/285,350 Office Action dated May 16, 2016.
U.S. Appl. No. 14/285,350 Amendment dated Jun. 3, 2016.
U.S. Appl. No. 14/285,350 Notice of Allowance dated Jun. 16, 2016.
U.S. Appl. No. 14/228,628 Amendment dated Jun. 27. 2016.
U.S. Appl. No. 12/580,849 Office Action dated Jul. 29, 2016.
U.S. Appl. No. 14/192,715 Office Action dated Aug. 19, 2016.
U.S. Appl. No. 14/330,410 Office Action dated Oct. 25, 2016.
U.S. Appl. No. 14/192,715 Amendment dated Nov. 15, 2016.
U.S. Appl. No. 14/228,628 Office Action dated Dec. 19, 2016.
U.S. Appl. No. 14/192,715 Office Action dated Dec. 29, 2016.
U.S. Appl. No. 14/330,419 Amendment dated Jan. 25, 2017.
U.S. Appl. No. 14/192,715 Amendment dated Mar. 28, 2017.
TW098118664 (English translation) Office Action dated Jan. 20, 2014; 3 pages.
TW098118661 Office Action(English translation) dated Jan. 20, 2014, 4 pages.
TW 098106029 Office Action dated Feb. 21, 2014 (TW/English translation) and Search Report (English translation) dated Oct. 15, 2013; pp. 9.
JP2010188934 Amendment/Appeal Brief (Japanese and English transled claims) dated Mar. 12, 2014.
EP09762938.0 Amendment dated Apr. 3, 2014; 8 pages.
JP2012279682 (Japanese and English translation of claims) Amendment dated Apr. 11, 2014.
JP2013028632 (Japanese and English Claims) Amendment dated Apr. 25, 2014; 10 pages.
JP2012279683 JP Office Action dated May 13, 2014.
JP2010548951 Office Action (Japanese) dated May 14, 2014.
TW 098106029 Amendment May 22, 2014 (TW) pp. 4.
JP2010188934 Response to Pre Appeal Examination (Japanese) dated Jul. 3, 2014.
EP09714025.5 Office Action dated Aug. 14, 2014; 3 pages.
JP2010548951 Notice of Appeal, Appeal Brief, and Amendment (Japanese-English translation of claims) dated Aug. 14, 2014; 9 pages.
TW98118661 Amendment (Taiwanese/English Translation) dated Aug. 2014, 18 pages.
TW098118664 (Taiwanese/English Translation) Amendment dated Aug. 2014; 11 pages.
JP2012279682 Office Action dated Nov. 18, 2014 (Japanese/English translation); 7 pages.
JP2010188934 Office Action dated Dec. 19, 2014 (Japanese/English translation); 4 pages.
EP09714025.5 Response to Office Action and amendments dated Feb. 24, 2015; 21 pages.
JP2010188934 Response to Office Action and amendment (Japanese/English translation of claims) dated Mar. 13, 2015; 7 pages.
JP2010188934 Japanese Notice of Allowance dated Apr. 9, 2015; 2 pages.
EP09759458.4 Office Action dated Apr. 30, 2015.
JP2012279682 Response to Office Action and amendment (Japanese/English translation of claims) dated May 18, 2015: 11 pages.
JP2012279682 Office Action (Japanese/English translations) dated Jun. 15, 2015.
EP09714025.5 Office Action dated Aug. 11, 2015; 2 pages.
EP09759458.4 Response to Office Action dated Sep. 3, 2015.
EP09759459.2 Office Action dated Oct. 12, 2015.
JP2012279682 (Japanese and English translation of claims) Amendment dated Dec. 15, 2015.
EP 09762938.0 Office Action dated Dec. 18, 2015.
EP09714025.5 Response to Office Action dated Feb. 10, 2016; 5 pages.
EP0975459.2 Response to Office Action dated Apr. 12, 2016.
EP 09762938.0 Response to Office Action dated Apr 25, 2016.
EP09759459.2 Office Action dated Oct. 6, 2016.
EP09759459.2 Response and amendment dated Feb. 10, 2017.

\* cited by examiner

| Sample ID | Ti | Cr | Fe | Ni | Co |
|---|---|---|---|---|---|
| 1 Before anneal Ga-face | $7.0 \times 10^{17}$ | $1.3 \times 10^{17}$ | $2.3 \times 10^{18}$ | $2.2 \times 10^{17}$ | $1.0 \times 10^{17}$ |
| 2 Before anneal N-face | $3.1 \times 10^{17}$ | $2.6 \times 10^{16}$ | $7.8 \times 10^{17}$ | $1.4 \times 10^{17}$ | $3.4 \times 10^{16}$ |
| 3 After anneal Ga-face | $5.0 \times 10^{16}$ | $1.1 \times 10^{16}$ | $1.4 \times 10^{18}$ | $2.0 \times 10^{16}$ | $1.1 \times 10^{16}$ |
| 4 After anneal-N-face | $1.2 \times 10^{17}$ | $\leq 6 \times 10^{14}$ | $3.0 \times 10^{16}$ | $1.0 \times 10^{16}$ | $9.0 \times 10^{15}$ |
| Detection Limit | $8 \times 10^{15}$ | $6 \times 10^{14}$ | $9 \times 10^{15}$ | $8 \times 10^{15}$ | $2 \times 10^{15}$ |

FIG. 3

| Sample ID | Li | Na | Mg | K |
|---|---|---|---|---|
| 1 Before anneal Ga-face | $8.0 \times 10^{14}$ | $7.8 \times 10^{18}$ | $1.0 \times 10^{17}$ | $1.7 \times 10^{16}$ |
| 2 Before anneal N-face | $2.0 \times 10^{14}$ | $1.2 \times 10^{19}$ | $1.2 \times 10^{17}$ | $4.0 \times 10^{16}$ |
| 3 After anneal Ga-face | $1.2 \times 10^{15}$ | $2.4 \times 10^{19}$ | $1.2 \times 10^{17}$ | $4.1 \times 10^{16}$ |
| 4 After anneal N-face | $4.0 \times 10^{13}$ | $2.0 \times 10^{17}$ | $3.9 \times 10^{16}$ | $<3 \times 10^{14}$ |
| Detection Limit | $3 \times 10^{13}$ | $6 \times 10^{14}$ | $5 \times 10^{14}$ | $3 \times 10^{14}$ |

FIG. 4

METHOD FOR PRODUCING GROUP III-NITRIDE WAFERS AND GROUP III-NITRIDE WAFERS

This application claims the benefit of priority to U.S. App. Ser. No. 61/067,117 entitled "Method for Producing Group III Nitride Wafers and Group III Nitride Wafers," inventors Tadao Hashimoto, Edward Letts, and Masanori Ikari, filed Feb. 25, 2008, the contents of which are incorporated by reference herein in their entirety as if put forth in full below. This application also incorporates by reference the International Application WO2009/108700 filed concurrently with the present application, entitled "Method for Producing Group III Nitride Wafers and Group III Nitride Wafers," inventors Tadao Hashimoto, Edward Letts, and Masanori Ikari.

BACKGROUND

1. Field of the Invention

The invention is related to the production of group III nitride wafers using the ammonothermal method.

2. Further Information on Group III-Nitride Materials and Manner of Making

Gallium nitride (GaN) and its related group III alloys are the key material for various opto-electronic and electronic devices such as light emitting diodes (LEDs), laser diodes (LDs), microwave power transistors, and solar-blind photo detectors. Currently LEDs are widely used in cell phones, indicators, displays, and LDs are used in data storage discs. However, a majority of these devices are grown epitaxially on heterogeneous substrates, such as sapphire and silicon carbide, since GaN wafers are extremely expensive compared to these heteroepitaxial substrates. The heteroepitaxial growth of group III nitride causes highly defected or even cracked films, which hinders the realization of high-end optical and electronic devices, such as high-brightness LEDs for general lighting or high-power microwave transistors.

To solve fundamental problems caused by heteroepitaxy, it is useful to utilize single crystalline group III nitride wafers sliced from bulk group III nitride crystal ingots. For a majority of devices, single crystalline GaN wafers are favorable because it is relatively easy to control the conductivity of the wafer, and GaN wafer will provide smallest lattice/thermal mismatch with device layers. However, due to high melting point and high nitrogen vapor pressure at high temperature, it has been difficult to grow group III nitride crystal ingots. Growth methods using molten Ga, such as high-pressure high-temperature synthesis ([1] S. Porowski, MRS Internet Journal of Nitride Semiconductor, Res. 4S1, (1999) G1.3; [2] T. Inoue, Y. Seki, O. Oda, S. Kurai, Y. Yamada, and T. Taguchi, Phys. Stat. Sol. (b), 223 (2001) p. 15) and sodium flux ([3] M. Aoki, H. Yamane, M. Shimada, S. Sarayama, and F. J. DiSalvo, J. Cryst. Growth 242 (2002) p. 70; [4] T. Iwahashi, F. Kawamura, M. Morishita, Y. Kai, M. Yoshimura, Y. Mori, and T. Sasaki, J. Cryst Growth 253 (2003) p. 1), have been proposed to grow GaN crystals, nevertheless the crystal shape grown in molten Ga favors thin platelet formation because molten Ga has low solubility of nitrogen and a low diffusion coefficient of nitrogen.

An ammonothermal method, which is a solution growth method using high-pressure ammonia as a solvent, has demonstrated successful growth of bulk GaN ingots ([5] T. Hashimoto, F. Wu, J. S. Speck, S. Nakamura, Jpn. J. Appl. Phys. 46 (2007) L889). This newer technique called ammonothermal growth has a potential for growing large GaN crystal ingots, because high-pressure ammonia used as a fluid medium has high solubility of source materials, such as GaN polycrystals or metallic Ga, and has high transport speed of dissolved precursors. However, state-of-the-art ammonothermal method ([6] R. Dwiliński, R. Doradziński, J. Garczyński, L. Sierzputowski, Y. Kanbara, U.S. Pat. No. 6,656,615; [7] K. Fujito, T. Hashimoto, S. Nakamura, International Patent Application No. PCT/US2005/024239, WO07008198; [8] T. Hashimoto, M. Saito, S. Nakamura, International Patent Application No. PCT/US2007/008743, WO07117689; See also US20070234946, U.S. application Ser. No. 11/784,339 filed Apr. 6, 2007), can only produce brownish crystals. This coloration is mainly attributed to impurities. In particular, oxygen, carbon and alkali metal concentration of the sliced wafers from GaN ingots is extremely high. The brownish wafer shows large optical absorption, which deteriorates the efficiency of light emitting devices grown on such wafers.

Each of the references above is incorporated by reference in its entirety as if put forth in full herein, and particularly with respect to description of methods of making using ammonothermal methods and using these gallium nitride substrates.

SUMMARY OF THE INVENTION

The present invention provides a new production method for group III nitride wafers. In one embodiment of the invention, after group III nitride ingots are grown by the ammonothermal method, the ingots are sliced into pieces such as wafers having a thickness between about 0.1 mm and about 1 mm, for instance. Then, the pieces are annealed in a manner that improves transparency of the pieces and avoids dissociation and/or decomposition of the pieces. A surface portion of the pieces may then be removed if desired.

Resultant pieces such as wafers may differ from other ingot-derived or individually-grown pieces or wafers in their (1) transparency and (2) in their amount and/or distribution of impurities or their surface morphology resulting from having a surface layer removed, or both.

BRIEF DESCRIPTION OF THE DRAWINGS

Referring now to the drawings in which like reference numbers represent corresponding parts throughout:

FIG. 3 is the concentration of heavy metal impurities before and after the annealing in Example 1 measured by secondary ion mass spectroscopy (SIMS). The unit of the concentration is atoms/cm3.

FIG. 4 is the concentration of light metal impurities before and after the annealing in Example 1 measured by secondary ion mass spectroscopy (SIMS). The unit of the concentration is atoms/cm$^3$.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description of Aspects of the Invention

Figure 1:
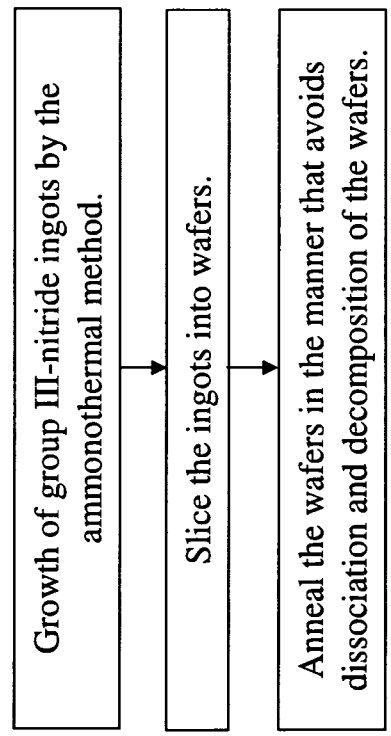
FIG. 1 is a flow chart for the production of group III nitride wafers.

The present invention provides a method of producing group III (group 13) nitride wafers, primarily group III nitride single crystalline wafers that include at least one of the group III elements B, Al, Ga and In, such as GaN, AlN and InN. The process flow for one embodiment of the invention is indicated in FIG. 1. A group III nitride ingot is grown by the ammonothermal method, the ingot is cut into pieces, and the pieces are annealed preferably in a manner which limits or avoids dissociation and decomposition of piece surfaces. The pieces may be wafers as are typically used to form various semiconductor or optoelectronic devices, such as LEDs, laser diodes, solar cells, and photodetectors.

Ammonothermal Growth of Group III-Nitride Ingot

Figure 2:
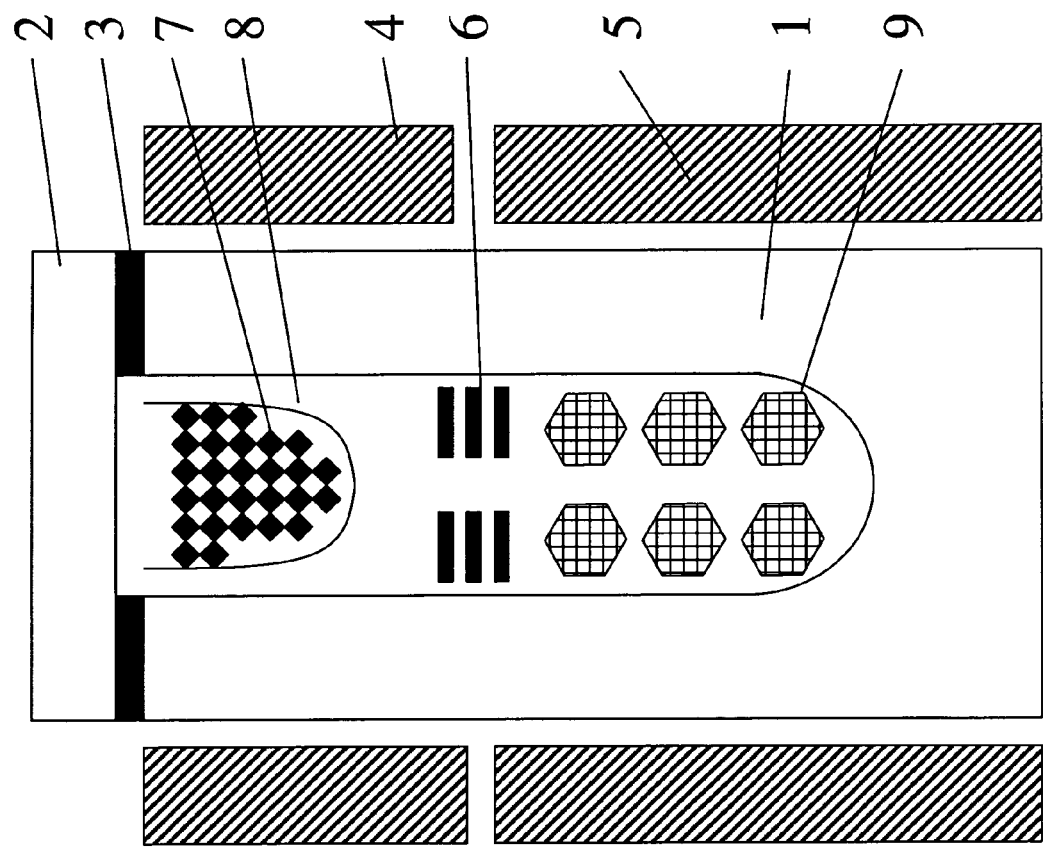
FIG. 2 is an example of the ammonothermal growth apparatus. 1 reaction vessel, 2 lid, 3 gasket, 4 heater for the dissolution region, 5 heater for the crystallization region, 6 convection-restricting device, 7 group III-containing nutrient, 8 nutrient basket, 9 group III nitride seed crystals.

Ammonothermal ingot growth utilizes high-pressure $NH_3$ as a fluid medium, a nutrient containing at least one of the group III elements, and one or more seed crystals that are group III nitride single crystals. The high-pressure $NH_3$ provides high solubility of the nutrient and high transport speed of dissolved precursors. FIG. 2 shows an example of one ammonothermal reaction vessel in which the method may be carried out.

Methods of ammonothermal growth are discussed in WO08/51589 and in U.S. application Ser. No. 11/977,661, the contents of which are incorporated by reference in their entirety herein as if put forth in full below. The growth medium may therefore optionally contain a mineralizer. Basic mineralizers include Li, Na, K, $LiNH_2$, $NaNH_2$, and/or $KNH_2$. Acidic mineralizers include $NH_4F$, $NH_4Cl$, $NH_4Br$, and/or $NH_4I$.

Other ammonothermal growth methods may be used, such as those discussed in WO07/08198 and WO07/117689, which are incorporated by reference in their entirety herein as if put forth in full below.

The group III-nitride ingot (such as GaN) may be in the wurtzite crystal configuration or in the zincblende crystal configuration, for example.

Ingot Slicing

After a group III nitride ingot is grown, the ingot is sliced into wafers or crystalline pieces of other shape(s). An ingot may be sliced by any suitable equipment or method. A cutter such as a mechanical saw (e.g. a wire saw), a dicing saw, or a laser may be used. Wafers cut from the ingot may have a thickness between about 0.1 mm and about 1 mm, for instance. Wafers or other ingot pieces may be cut from an ingot along a Group III element face of the crystal (e.g. Ga face of the crystal, (0001) face, (000-1) face, {11-20} face, {10-10} face or other low index planes.

Annealing Wafer or Other Piece

Wafers or other ingot pieces are annealed to improve transparency and reduce impurities, preferably in a manner that limits or avoids substantial dissociation or decomposition of the pieces. Once pieces are cut from an ingot, those pieces may be individually or collectively annealed in an annealing reactor.

An annealing reactor may be configured to expose all surfaces of the piece (e.g. wafer) to an annealing gas in an annealing environment if desired. The annealing gas may be ammonia, hydrogen, a mixture of hydrogen and ammonia, or other gas that may create a reducing environment. While not being bound by theory, it is postulated that a reducing gas either maintains the pieces intact, without substantial degradation or decomposition or reacts with contaminants in the crystalline pieces, making the contaminants volatile and thereby removing the contaminants from the pieces, or both. The annealing gas may alternatively be an inert gas such as nitrogen, or the annealing gas may be a mixture of nitrogen, ammonia, and/or hydrogen and/or other gas that may create a reducing environment.

The annealing temperature may be selected to remove the amount of contaminant desired for removal. The temperature is sufficiently high to cause contaminants to migrate within the piece or pieces being annealed. For GaN, the temperature is often between about 500 and 1300° C. Typically, the temperature is at or above 500, 700, 800, 900, 1000, 1100, or 1200° C. in ambient gas comprising $NH_3$ and $H_2$. At about 1300° C., the pieces being annealed may decompose or etch somewhat. Consequently, it may be desirable to anneal at a temperature of no more than about 1300° C. in $NH_3$ and $H_2$ ambient. An annealing temperature of 1200° C. works well.

The pieces are annealed for a sufficient length of time to remove contaminants to a desired concentration in the pieces. Pieces may be annealed for at least about 15, 30, 45, or 60 minutes, for instance. If a lower temperature is used, often pieces may be annealed for a longer period of time to reduce contaminant concentration to the desired level. Although the annealing time depends on annealing temperature, the length of time that the pieces or ingot are annealed is sufficiently long to remove contaminants but not too long in order to avoid substantial degradation of crystal quality.

It has been observed that certain contaminants such as alkali metals concentrate at a Ga face of the crystal. Likewise, alkaline earth metals may concentrate at a Ga face. The annealing gas may be preferentially directed at the Ga face in order to reduce the concentration of these contaminants in the crystalline pieces or ingot. The length of time and annealing temperature may be selected based on the high concentration of these contaminants at a Ga face, and therefore the annealing conditions such as temperature and time may be different than for the case where these contaminants are dispersed throughout the crystalline pieces.

Annealing is typically carried out at atmospheric pressure (i.e. 1 bar). If the annealing temperature is close to the dissociation temperature, annealing can be carried out under pressure, for instance at or above 10 bar, 100 bar, or 1000 bar. On the other hand, if major contaminants are less volatile material, annealing can be carried out at subatmospheric or low pressure, for instance at or below 100 mbar, 10 mbar, 1 mbar, or less.

Ingot Annealing

A similar method can be utilized on the ingot itself. The ingot may be annealed in an annealing environment that limits or avoids substantial ingot dissociation or decomposition. The ingot may be annealed in addition to annealing pieces such as wafers cut from the ingot, or the ingot may be annealed instead of annealing its pieces.

Optional Surface Removal

Impurities may be further reduced by removing a surface layer of the wafers to which impurities have migrated. In one instance, at least a portion of a Group III element surface layer is removed (e.g. a Ga surface layer). Subsequent to ingot annealing, an outer surface or layer of the ingot may optionally be removed to reduce the concentration of the impurities in the ingot.

In some instances, any of the methods as discussed above reduce the concentration of heavy metals such as Ti, Cr, Fe, Ni, and Co (each metal alone or any combination of these heavy metals).

In some instances, any of the methods as discussed above reduce the concentration of alkali or alkaline earth metals such as Li, Na, Mg, and K (each metal alone or any combination of these metals). A portion of a surface layer may be removed that contains these metals, especially a Ga surface layer of the crystal of the ingot or wafer. The amount of surface of wafers or ingot that may be removed can vary depending upon how much impurity can be tolerated in the wafer or ingot during use.

Further Considerations

The amount of impurity may be reduced by any method above to no more than about 60%, 50%, 40%, 30%, 20%, 15%, 10%, or 5% of the concentration of that impurity at a face (e.g. Ga or other group III element or nitride face) prior to annealing. Annealing may reduce the level of the contaminant to below a detectable level. See in particular the tables in FIGS. 3 and 4, which indicate how much the concentration was reduced for various contaminants at the Group III element face and the nitride face. The concentration of contaminants was measured with secondary ion mass spectroscopy (SIMS).

The contaminant removed may be a metal. Alkali and alkaline earth metals may be removed in certain embodiments. Likewise, heavy metals selected from transition metals (e.g. Ti, Cr, Fe, Ni, and Co), metalloids such as Ge or heavier, rare earth metals, and other metals having similar atomic weight may be removed. The concentration of heavy metal impurities such as Ti, Cr, Fe, Ni or Co may be less than about $1 \times 10^{17}$ cm$^{-3}$ after an ingot or pieces are treated according to a method herein. The concentration of light metals (metals such as Li, Na, K, and Mg) may likewise be less than about $1 \times 10^{17}$ cm$^{-3}$ after an ingot or pieces are treated according to a method herein.

The annealing above differs from annealing after e.g. implanting a crystalline material with a dopant. Typically a substrate is annealed after implanting dopant atoms in order to diffuse the atoms to a certain depth and therefore decrease the concentration of the dopant in the substrate at the point of implantation. In the method of the invention, impurities may be concentrated locally (such as at a group III element face of the crystalline structure) rather than diffused, and/or impurities may be removed from the substrate by annealing it.

The annealed pieces or ingot may be used to form various electronic or optoelectronic devices. Electronic and optoelectronic devices include those disclosed in U.S. application Ser. No. 11/765,629, filed Jun. 20, 2007 and entitled "Opto-Electronic and Electronic Devices Using N-Face or M-Plane GaN Substrate Prepared With Ammonothermal Growth", the contents of which are incorporated by reference herein in their entirety as if put forth in full below.

The following examples describe a detailed procedure within the scope of the current invention to help illustrate the invention further.

Example 1

In this example, a reaction vessel having an inner diameter of 1 inch was used for the ammonothermal growth. All necessary sources and internal components including 10 g of polycrystalline GaN nutrient held in Ni mesh basket, 0.3 mm-thick single crystalline GaN seeds, and three baffles, which acts as a flow restriction device were loaded into a glove box together with the reaction vessel. The glove box is filled with nitrogen and the oxygen and moisture concentration is maintained to be less than 1 ppm. Since the mineralizers are reactive with oxygen and moisture, the mineralizers are stored in the glove box all the time. 4 g of as-received NaNH$_2$ was used as a mineralizer. After loading mineralizer into the reaction vessel, three baffles together with seeds and nutrient are loaded. After closing the lid of the reaction vessel, it was taken out of the glove box. Then, the reaction vessel is connected to a gas/vacuum system, which can pump down the vessel as well as can supply NH$_3$ to the vessel. First, the reaction vessel was evacuated with a turbo molecular pump to achieve pressure less than $1 \times 10^{-5}$ mbar. The actual pressure in this example was $1.2 \times 10^{-6}$ mbar. In this way, residual oxygen and moisture on the inner wall of the reaction vessel are partially removed. After this, the reaction vessel was chilled with liquid nitrogen and NH$_3$ was condensed in the reaction vessel. About 40 g of NH$_3$ was charged in the reaction vessel. After closing the high-pressure valve of the reaction vessel, it was transferred to a two zone furnace. The reaction vessel was heated to 575° C. of the crystallization zone and 510° C. for the dissolution zone. After 7 days, ammonia was released and the reaction vessel was opened. The total thickness of the grown GaN ingot was 0.99 mm.

Since the thickness of the ingot was less than 1 mm, the ingot shape was already wafer-like without slicing. The wafer-like ingot had Ga-polar (0001) surface and N-polar (000-1) surface as basal planes. The wafer-shaped ingot was then loaded into an annealing reactor. The wafer-shaped ingot stood on its edge so that the both sides of the basal planes were exposed to the gas stream. After evacuating the air in the reactor, forming gas (4% H$_2$/96% N$_2$) was introduced to the reactor. Then, the reactor was heated. At 485° C., ammonia was introduced to the reactor to suppress dissociation or decomposition. The flow rate of ammonia and the forming gas was 1 slm and 1.1 slm, respectively. The wafer-shaped ingot was annealed at 1100° C. for about 1 hour. Then, the reactor was cooled. At about 400° C., ammonia was shut off.

The coloration in a wafer-like ingot prepared as described above was observably reduced when its coloration was compared to the coloration of a wafer-like ingot that was not annealed. This reduction in coloration in the annealed ingot indicates the reduction of impurities. The impurity quantification by secondary ion mass spectroscopy (SIMS) confirmed reduction of heavy metals such as Ti, Cr, Fe, Ni, and Co as shown in FIG. 3. On the other hand, light metals such as alkali metals and alkali earth metals moved toward Ga-polar surface. As shown in FIG. 4, the concentration of Li, Na, Mg, and K increased after annealing on the Ga-polar side whereas it decreased on the N-polar side. This suggests that alkali metals and alkali earth metals are positively charged and they are attracted by the surface charge on the Ga-polar surface, resulting in accumulation of these impurities on the top Ga-polar surface. Therefore, we can efficiently remove alkali metals and alkali earth metals from the wafer with annealing followed by removing a portion of the Ga-polar surface by e.g. grinding, lapping, polishing, or etching the Ga-polar surface.

Example 2

In this example a GaN ingot was formed by the same method as described in Example 1. The GaN ingot was sliced into 0.4 mm-thick wafers with a wire saw. Then 6 wafers were annealed at different temperatures (500, 700, 900, 1100, 1200, and 1300° C. in NH$_3$ ambient for 1 hour) by the following process.

A wafer was placed into a reactor. After evacuating air in the reactor, a forming gas (4% H$_2$/96% N$_2$) was introduced into the reactor, and subsequently the reactor was heated. At 485° C., ammonia was introduced to the reactor to suppress dissociation or decomposition of the GaN. The flow rate of ammonia and the forming gas was 1 slm and 1.1 slm, respectively. During annealing both the Ga-face and the N-face of each wafer was exposed to the ambient gas. When the GaN wafer was annealed at 1300° C., the surface of the wafer was etched away. Therefore, if ammonia is used to suppress dissociation or decomposition, the temperature is typically less than 1300° C. to avoid surface etching during annealing.

Properties of wafers annealed by the method above were compared to an unannealed wafer. Each wafer has three regions: a Ga-face region; a seed region; and a N-face region from the left in each wafer. The unannealed wafer had a dark N-face region and a slightly tinted Ga-face region together with a clear seed region. The coloration on the Ga-face was reduced with annealing even at 500° C. Slight reduction of coloration was observed for wafers annealed at 500, 700, 900, and 1100° C. Annealing at 1200° C. made a drastic change: the N-face region showed much brighter color although the seed region and the Ga-face region showed slight coloration. Therefore, annealing at 1200° C. is effective for N-face region.

The following theory is of course not limiting on the scope of the invention. The difference in the coloration in the seed region and the Ga-face region implies that coloration is not only governed by an impurity, but also by native defects such as point defects. From the color change in the N-face region, it is believed that some impurities diffused out from the N-face region, thus the N-face region acted as an impurity source. The seed region, which was closer to the N-face region must have higher impurity concentration than Ga-face region which is farther from the N-face region. Therefore, if coloration is only due to impurity concentration, one might expect the seed region to be darker than the Ga-face region. However, the seed region was brighter than the Ga-face region. This implies that the Ga-face region originally had higher defects which, when combined with an impurity, will act as a color center. Therefore, it appears to be desirable to reduce native defects such as point defects in the ammonothermally grown group III-nitride crystals.

From this example, we found that annealing in ammonia is preferably performed at a temperature less than 1300° C. when surface etching of GaN is not desired, preferably between 500 and 1300° C., or more preferably between 1100 and 1300° C. The pressure may be about 1 bar, or the pressure may be sub-atmospheric or above atmospheric pressure as discussed above.

Advantages and Improvements

The present invention provides a new production method for group III nitride wafers with improved transparency and purity. Annealing the wafers after slicing is an effective way to reduce impurities in the crystal since the necessary time for the impurities to diffuse out of the crystal can be much smaller than the situation of annealing the ingot before slicing. The purified wafer showed improved transparency which improves efficiencies of optical devices fabricated on the wafers.

Conclusion

This concludes the description of the preferred embodiment of the invention. The following describes some alternative embodiments for accomplishing the present invention.

Although the preferred embodiment describes the growth of GaN as an example, other group III nitride crystals may be used in the present invention. The group III nitride materials may include at least one of the group III elements B, Al, Ga, and In.

Although the preferred embodiment describes the annealing of ingots or wafers in ammonia ambient, other method to avoid dissociation or decomposition can be used. For example, covering the wafer surface with a silicon oxide layer, a silicon nitride layer, a metal layer or other protective layer is expected to be effective way to avoid dissociation and decomposition of the wafer. One or more of these layers may be deposited on a wafer using e.g. chemical vapor deposition or sputtering. If desired, the protective layer or layers may be removed using conventional etching techniques immediately before using a wafer to form a device.

Although the preferred embodiment describes the annealing at 1100-1200° C. for 1 hour or other time sufficient to improve wafer clarity, other temperatures and/or times can be utilized so long as the same or similar benefit can be obtained.

In the preferred embodiment specific growth apparatuses and annealing apparatus are presented. However, other constructions or designs that fulfill the conditions described herein will have the same benefit as these examples.

The present invention does not have any limitations on the size of the wafer, so long as the same benefits can be obtained.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for producing group III nitride crystalline pieces, comprising:
   (a) growing a group III nitride ingot by the ammonothermal method;
   (b) slicing a piece out of the ingot;
   (c) annealing the piece for a time at a temperature and pressure sufficient to reduce a contaminant in said piece;
   (d) concentrating the contaminant at a surface of the piece, and, subsequent to the annealing in step (c), removing an amount of the surface of the piece to reduce the amount of the contaminant in the piece.

2. The method of claim 1, wherein said annealing is carried out in a reducing ambient.

3. The method of claim 2, wherein the reducing ambient comprises ammonia.

4. The method of claim 2, wherein the reducing ambient comprises hydrogen.

5. The method of claim 2 or claim 3, wherein the surface of the piece is a group III element surface and the contaminant comprises at least one member selected from an alkali metal and an alkaline earth metal that is positively charged.

6. The method of claim 1, wherein step (c) is carried out after step (b).

7. The method of claim 1, wherein the group III nitride is GaN.

8. The method of claim 7, wherein said annealing is carried out in a reducing ambient.

9. The method of claim 8, wherein the reducing ambient comprises ammonia.

10. The method of claim 8, wherein the reducing ambient environment comprises hydrogen.

11. The method of claim 9, wherein step (c) is carried out after step (b).

12. The method of claim 8 or claim 9, wherein the surface of the piece is a gallium polar surface and the contaminant comprises at least one member selected from an alkali metal and an alkaline earth metal that is positively charged.

13. The method of claim 7, wherein the annealing temperature is between about 1100 and 1300° C.

14. The method of claim 13, wherein the pressure is about 1 bar.

15. The method of claim 14, wherein the reducing ambient comprises ammonia.

16. The method of claim 15, wherein step (c) is carried out after step (b).

17. The method of claim 13, wherein the reducing ambient comprises ammonia.

18. The method of claim 17, wherein step (c) is carried out after step (b).

19. The method of claim 7, wherein the annealing temperature is no more than about 1300° C.

20. The method of claim 15 or claim 17 wherein the surface of the piece is a gallium polar surface and the contaminant comprises at least one member selected from an alkali metal and an alkaline earth metal that is positively charged.

21. The method of claim 5, wherein said ingot has a wurtzite crystalline structure.

22. The method of claim 12, wherein said ingot has a wurtzite crystalline structure.

23. The method of claim 20, wherein said ingot has a wurtzite crystalline structure.

24. The method of claim 12, wherein the reducing ambient is directed against the gallium polar surface.

25. The method of claim 20, wherein the reducing ambient is directed against the gallium polar surface.

26. The method of claim 13, wherein a reducing ambient comprises a forming gas and ammonia.

27. The method of claim 26, wherein the annealing temperature is about 1200° C.

28. The method of claim 1 wherein said piece comprises a wafer suitable for forming an electronic device.

29. The method of claim 28, wherein said wafer comprises a single-crystalline wafer.

30. The method of claim 1 wherein said surface is a gallium-polar surface and said contaminant comprises at least one member of the group of alkali metals and alkaline earth metals.

* * * * *